(12) United States Patent
Acar et al.

(10) Patent No.: US 8,373,454 B2
(45) Date of Patent: Feb. 12, 2013

(54) POWER STAGE

(75) Inventors: Mustafa Acar, Eindhoven (NL);
Katarzyna Nowak, Helmond (NL)

(73) Assignee: NXP B.V., Eindhoven (NL)

( * ) Notice: Subject to any disclaimer, the term of this patent is extended or adjusted under 35 U.S.C. 154(b) by 136 days.

(21) Appl. No.: 12/829,250

(22) Filed: Jul. 1, 2010

(65) Prior Publication Data

US 2011/0006814 A1    Jan. 13, 2011

(30) Foreign Application Priority Data

Jul. 2, 2009  (EP) .................................. 09164445

(51) Int. Cl.
*H03K 3/00*  (2006.01)

(52) U.S. Cl. .......................... 327/112; 327/108; 327/110

(58) Field of Classification Search .................. 327/108
See application file for complete search history.

(56) References Cited

U.S. PATENT DOCUMENTS

| | | | |
|---|---|---|---|
| 3,273,033 A | 9/1966 | Rossmeisl | |
| 4,292,595 A | 9/1981 | Smith | |
| 4,748,419 A | 5/1988 | Somerville | |
| 5,138,436 A | 8/1992 | Koepf | |
| 5,187,636 A | 2/1993 | Nakao | |
| 5,187,637 A | 2/1993 | Embree | |
| 5,321,597 A | 6/1994 | Alacoque | |
| 6,271,131 B1 | 8/2001 | Uhlenbrock et al. | |
| 6,331,999 B1 | 12/2001 | Ducaroir | |
| 6,347,395 B1 | 2/2002 | Payne et al. | |
| 6,429,735 B1 * | 8/2002 | Kuo et al. | 327/563 |
| 6,507,226 B2 * | 1/2003 | Swonger et al. | 327/108 |
| 6,636,166 B2 | 10/2003 | Sessions et al. | |
| 6,664,859 B1 | 12/2003 | Chen | |
| 6,809,569 B2 | 10/2004 | Wang | |
| 6,839,862 B2 | 1/2005 | Evoy et al. | |
| 6,859,883 B2 | 2/2005 | Svestka et al. | |
| 6,882,046 B2 | 4/2005 | Davenport et al. | |
| 6,920,576 B2 | 7/2005 | Ehmann | |
| 7,199,617 B1 * | 4/2007 | Schrom et al. | 326/86 |
| 7,302,247 B2 | 11/2007 | Dupuis | |
| 7,376,212 B2 | 5/2008 | Dupuis | |
| 7,400,173 B1 * | 7/2008 | Kwong et al. | 326/86 |
| 7,411,421 B1 * | 8/2008 | Steinke et al. | 326/83 |
| 7,421,028 B2 | 9/2008 | Dupuis | |
| 7,447,492 B2 | 11/2008 | Dupuis | |
| 7,460,604 B2 | 12/2008 | Dupuis | |
| 7,577,223 B2 | 8/2009 | Alfano et al. | |

(Continued)

FOREIGN PATENT DOCUMENTS

| | | |
|---|---|---|
| EP | 1291918 A2 | 12/2003 |
| EP | 1564884 A1 | 8/2005 |

(Continued)

OTHER PUBLICATIONS

Extended European Search Report for European Pat. Appln. No. 09164445.0 (Nov. 26, 2009).

(Continued)

*Primary Examiner* — Ryan Jager

(57) ABSTRACT

An power stage has a differential output stage 2 driven by one or more buffer stages 4. The buffer stages 4 are implemented as high and low side buffers 12,14, each of which is itself a differential buffer implemented using transistors formed in an isolated-well technology such as triple-well CMOS.

10 Claims, 5 Drawing Sheets

U.S. PATENT DOCUMENTS

| | | | |
|---|---|---|---|
| 7,650,130 | B2 | 1/2010 | Dupuis |
| 7,732,889 | B2 | 6/2010 | Crawley et al. |
| 7,737,871 | B2 | 6/2010 | Leung et al. |
| 7,738,568 | B2 | 6/2010 | Alfano et al. |
| 7,755,400 | B2 | 7/2010 | Jordanger et al. |
| 7,821,428 | B2 | 10/2010 | Leung et al. |
| 7,856,219 | B2 | 12/2010 | Dupuis |
| 7,902,627 | B2 | 3/2011 | Dong et al. |
| 8,049,573 | B2 | 11/2011 | Alfano et al. |
| 8,064,872 | B2 | 11/2011 | Dupuis |
| 8,169,108 | B2 | 5/2012 | Dupuis et al. |
| 2001/0052623 | A1 | 12/2001 | Kameyama et al. |
| 2002/0014900 | A1* | 2/2002 | Swonger et al. ............. 327/108 |
| 2002/0021144 | A1* | 2/2002 | Morgan et al. ................ 326/57 |
| 2002/0184544 | A1 | 12/2002 | Svestka et al. |
| 2002/0186058 | A1 | 12/2002 | Prodanov |
| 2003/0214346 | A1 | 11/2003 | Pelliconi |
| 2004/0076192 | A1 | 4/2004 | Zerbe |
| 2004/0159893 | A1 | 8/2004 | Kitahara |
| 2004/0161068 | A1 | 8/2004 | Zerbe |
| 2005/0127452 | A1* | 6/2005 | Rippke et al. ................ 257/372 |
| 2005/0174156 | A1 | 8/2005 | Wu |
| 2006/0138595 | A1 | 6/2006 | Kiyotoshi |
| 2007/0075784 | A1 | 4/2007 | Pettersson et al. |
| 2008/0174360 | A1* | 7/2008 | Hsu ............................. 327/536 |
| 2008/0290444 | A1 | 11/2008 | Crawley et al. |
| 2009/0146760 | A1 | 6/2009 | Reefman et al. |
| 2009/0213914 | A1 | 8/2009 | Dong et al. |
| 2009/0237858 | A1 | 9/2009 | Steeneken et al. |
| 2010/0052826 | A1 | 3/2010 | Callahan et al. |
| 2010/0118918 | A1 | 5/2010 | Dupuis |
| 2010/0327940 | A1* | 12/2010 | Eisenstadt et al. ............ 327/357 |
| 2011/0006814 | A1 | 1/2011 | Acar et al. |

FOREIGN PATENT DOCUMENTS

| | | |
|---|---|---|
| GB | 2204467 A | 11/1988 |

OTHER PUBLICATIONS

Greg Smith, "Hybrid Isolation Amps Zap Price and Voltage Barriers" Electronic Design, Dec. 11, 1986, pp. 91-?

Wally Meinel, et al., "Hermetic Analog Isolation Amplifier", Proceedings of the 1987 International Symposium on Microelectronics, Minneapolis, Sep. 1987.

Burr Brown, Noise Sources in Applications Using Capacitive Coupled Isolated Amplifiers, Application Bulletin, Burr Brown Corporation, 1993.

Burr Brown, Hybrid Isolation Amps Zap Price and Voltage Barriers, Application Bulletin, Burr Brown Corporation, 1994.

Burr Brown, An error analysis of the ISO102 in a small signal measuring application, Application Bulletin, Burr Brown Corporation, 1994.

Burr Brown, ISO 102, ISO 106 Signal Isolation Buffer Amplifiers, Datasheet, Burr Brown Corporation, 1995.

J. Basilio Simoes, et al., "The Optical Coupling of Analog Signals" IEEE Transaction on Nuclear Science, vol. 43, No. 3, Jun. 1996, pp. 1672-1674.

Stephen L. Diamond, "IEEE 1394: Status and growth path", IEEE Micro, Jun. 1996, pp. 75-78.

Thaddeus J. Gabara, et al., "Capacitive coupling and quantized feedback applied to conventional CMOS technology" IEEE Journal of Solid-State Circuits, vol. 32, No. 3, Mar. 1997.

Adrian Paskins, "The IEEE 1394 BUS", The Institution of Electrical Engineers Conference, May 12, 1997.

Richard Crisp, "Direct Rambus Technology: The New Main Memory Standard" IEEE Micro, Nov./Dec. 1997, pp. 18-28.

Thomas Nilsson, "A distributed combined heat and power plant control unit", Master Thesis, Linköping Institute of Technology, Dec. 16, 1997.

Scott Wayne, "Finding the Needle in a Haystack: Measuring Small differential voltages in the presence of large-common mode voltages", Analog Dialogue, 34-1, 2000, pp. 1-4.

Infineon Technologies, IVAX Integrated Voice & ADSL Transceiver, PEB35512, PEB55508, PEB3558, PEB4565, PEB4566, Datasheet, Infineon Technologies AG, 2001.

William B. Kuhn, et al., "An RF-based IEEE 1394 Ground Isolator designed in silicon-on-insulator process" Circuits and Systems, 2001. MWSCAS 2001. Proceedings of the 44th IEEE 2001 Midwest Symposium on , vol. 2 , Aug. 14-17, 2001.

Scott Irwin, XILINX, "Usage Models for multi-gigabit serial transceivers", WP157, V.1.0, Mar. 15, 2002.

phyCORE-MCF548x Hardware Manual, PHYTEC Technology Holding Company, Jan. 2005.

LANTRONIX, Xpress-DR+Wireless, Datasheet, LANTRONIX, 2006.

Eugenio Culurciello, et al., "Capacitive inter-chip data and power transfer for 3-D VLSI" IEEE Trans. Circuits Syst. II, vol. 53, No. 12, pp. 1348-1352, 2006.

Geoffrey Marcus, et al., "A Monolithic Isolation Amplifier in silicon-on-isolator Cmos: Testing and Applications", Analog Integr. Circ. Sig. Process, Jun. 27, 2006.

Inoue, A et al "A high efficiency, high voltage, balanced cascode FET", IEEE International Microwave Symposium, Jun. 1995.

S. M. Sze, "Semiconductor Devices Physics and Technology", 2nd Edition, John Wiley and Sons, Inc., pp. 493-494 and 503-507, 1985, 2002.

Burr Brown, ISO 103, Low Cost, Internally Powered Isolation Amplifier, IC Publication Datasheet, Burr Brown Corporation, 1989.

Stephen Mick, et al., "Packaging Technology for AC Coupled Interconnection", IEEE Flip-Chip Conference, 2002.

* cited by examiner

POWER STAGE

The invention relates to a power stage, i.e. a driving stage as part of a semiconductor device, particularly but not exclusively a high stage for operating at a voltage above the low voltage levels used for modern CMOS designs.

Typical modern complementary metal oxide semiconductor (CMOS) processes are designed to operate on relatively low voltage. For example, 65 nm CMOS processes typically use 1.2V.

However, electronic circuits may need to deal with significantly higher voltages than this. A particular example is the case of battery powered circuits. Lithium ion batteries have a nominal voltage of 3.6 V but in practice the battery voltage may vary between 2.1V and 5.5V, depending on the charge state. Such voltages are higher than the voltage levels tolerated in standard CMOS, also known as base-line CMOS, that is to say with no additional process options.

Moreover, there is an increasing desire for minaturisation and hence integration. To integrate complete systems or even part systems on a chip, there is a need to integrate higher voltage blocks with standard CMOS. This applies, for example, to circuits such as radio frequency receivers, power amplifiers, and dc-dc power converters which need to be supplied directly by the battery voltage in battery powered applications.

Some proposals for dealing with voltages higher than the breakdown voltage of the transistors of standard CMOS circuits have been made. In particular, cascode circuits have been proposed. Inoue, A et al "A high efficiency, high voltage, balanced cascode FET", IEEE International Microwave Symposium, June 1995, describes such cascode circuits implemented using isolated MOS transistors, in particular triple-well isolated transistors.

An alternative approach is to use layout techniques such as the use of extended drain MOS transistors (EDMOS).

Unfortunately, although such techniques do allow higher voltages to be dealt with by CMOS circuits, they introduce an additional design issue of biasing. In particular, consider the case of driving a pair of high and low side output transistors arranged between a high battery voltage ($V_{bat}$) and a ground voltage ($V_{ss}$). In this case, a buffer driving the high side output transistor needs to be arranged between the battery voltage $V_{bat}$ and an intermediate bias voltage ($V_{bias}$), whereas a buffer driving the low side output transistor needs to be arranged between the intermediate bias voltage ($V_{bias}$) and the ground voltage ($V_{ss}$). The bias voltage is needed in particular for biasing the substrate of the high side buffer.

This in turn creates a routing difficulty, in that the bias voltage needs to be routed. This routing difficulty is particularly acute in multiple stage buffers, in which a plurality of buffers in series are used to drive the output transistors, or cascode circuits.

According to the invention there is provided a driver circuit according to claim 1.

In each buffer stage, a differential buffer is used for both the high side buffer and the low side buffer. In this way, the buffer is essentially self-biasing—there is no need to route a bias voltage to the intermediate transistors.

This gives a number of advantages. Firstly, routing is much easier since there is no need to route a bias voltage line. Secondly, the differential implementation delivers certain advantages, such as noise reduction. Thirdly, the differential implementation allows the use of smaller transistors which results in shorter and local connections, this in turn can reduce parasitics.

Further, it is to be noted that although at first sight the use of a differential buffer has the significant disadvantage of twice the number of transistors, the inventors have realised that since each of these transistors needs to carry only half the current, the transistors can have half the area of non-differential approaches and so in fact there is little or no area penalty.

For a better understanding of the invention embodiments will now be described, purely by way of example, with reference to the accompanying drawings, in which.

The drawings are schematic and not to scale. The same or corresponding components are given the same reference numbers in the different figures, and the description relating thereto is not necessarily repeated.

Figure 1:
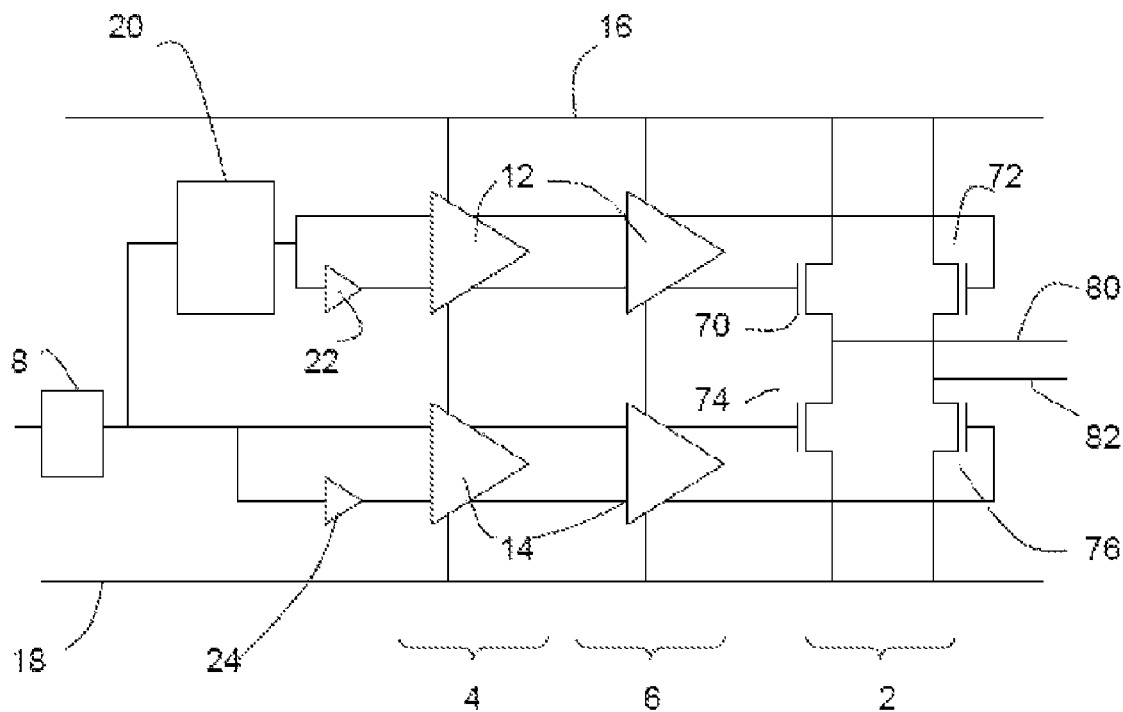
FIG. 1 shows a circuit diagram of a first embodiment of the invention.

Referring to FIG. 1, a first embodiment of the invention includes an output stage 2 driven by two buffer stages, a first buffer stage 4 and a second buffer stage 6.

An input stage 8 operates between a lower voltage $V_{dd}$ and $V_{ss}$ and outputs a logic level signal. Typically, the lower voltage $V_{dd}$ may be 1.2 V for conventional CMOS and the battery voltage $V_{bat}$ may be 3.6 V, taking the ground voltage as 0V.

Each buffer stage includes a high side buffer 12 and a low side buffer 14, arranged in series between a high side line 16, here carrying a battery voltage $V_{bat}$, and a low side line 18, carrying a source or ground voltage $V_{ss}$. The circuit used to implement the buffers 12,14 is discussed below with reference to FIG. 2. However, it is useful to note that each of the buffers is a differential buffer having a pair of inputs acting as a differential input pair and a corresponding pair of outputs.

A level shift circuit 20 converts the output of the input stage 8 to a higher level to input to the high side buffer 12 of the first buffer stage 4. A high-side inverter 22 drives the inverting input of the first buffer stage 4.

Similarly, on the low side the input stage drives the low side buffer 14 of the first buffer stage 4, driving the inverting input through a low side inverter 24.

The inverting outputs of the first buffer stage 4 drive the inverting inputs of the second buffer stage 6. The number of buffer stages may vary, but in the embodiment shown there are two buffer stages so the second buffer stage is also the last buffer stage.

The last buffer stage drives the output stage 2, which is a single differential output stage, in contrast to the buffer stages which include effectively two buffers, the high side buffer and the low side buffer.

Figure 2:
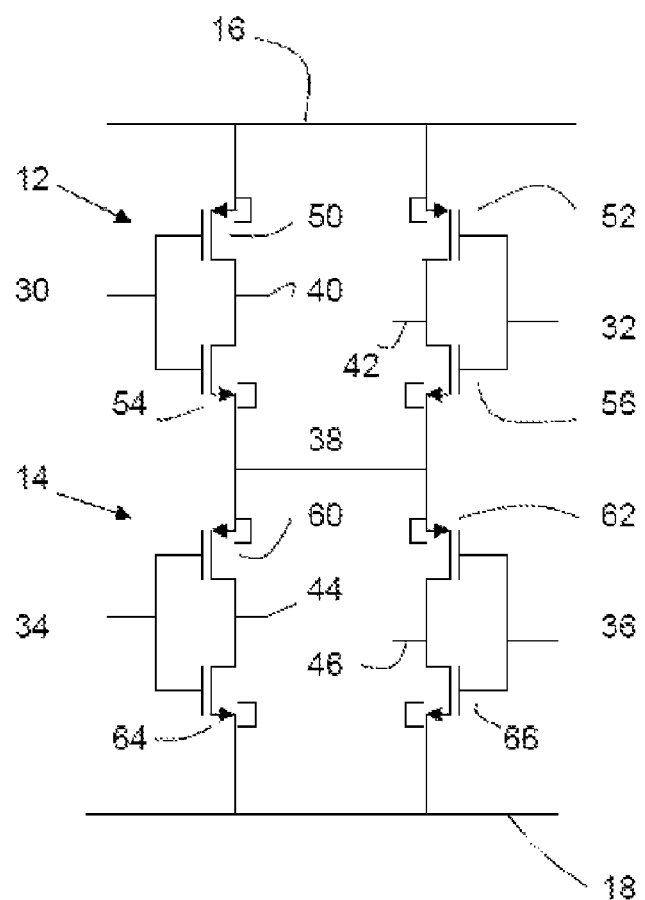
FIG. 2 shows a circuit diagram of part of the arrangement of FIG. 1.

Referring to FIG. 2, a single buffer stage is shown with high side buffer 12 and low side buffer 14.

The high side buffer 12 has a first input 30 and a second input 32.

A first p-type transistor 50 is connected in series with a first n-type transistor 54, the p-type transistor being on the high side, with the node between the first p-type transistor 50 and the first n-type transistor 54 being the first output 40 of the high side buffer. The first input 30 is connected to the gates of both the first p-type transistor 50 and the first n-type transistor 54.

A second p-type transistor 52 and a second n-type transistor 56 are connected in series with each other and in parallel with the first p-type and n-type transistors, again with the p-type transistor 52 on the high side, with the node between the second p-type and n-type transistors 52, 56 being the second output 42 of the high side buffer 12. The second input 32 is connected to the gates of both the second p-type transistor 52 and the second n-type transistor 56.

These components form a differential high side buffer accepting a differential input on the first input 30 and second input 32 and outputting a differential output on the first output 40 and the second output 42.

The low side buffer 14 has a corresponding structure forming a differential buffer with a first input 34 and a second input 36. In particular, a third p-type transistor 60 is connected in series with a third n-type transistor 64, the third p-type transistor being on the high side, with the node between the third p-type transistor 60 and the third n-type transistor 64 being the first output 44 of the low side buffer. The first input 34 is connected to the gates of both the third p-type transistor 60 and the third n-type transistor 64.

A fourth p-type transistor 62 and a fourth n-type transistor 66 are connected in series with each other and in parallel with the third p-type and n-type transistors, again with the fourth p-type transistor 62 on the high side, with the node between the fourth p-type and n-type transistors 62, 66 being the second output 46 of the low side buffer 12. The second input 36 is connected to the gates of both the fourth p-type transistor 62 and the fourth n-type transistor 66.

A bias line 38 connects the parallel parts of each of the circuits to each other. Importantly, because of the differential structure, this bias line 38 is self-biasing and is at an intermediate voltage between high side line 16 and low side line 18 without requiring an external bias.

The differential amplifier of the output stage 2 is implemented in the same way as the differential amplifiers in the high and low sides of the buffer stages.

A first p-type transistor 70 is connected in series with a first n-type transistor 74, the p-type transistor being on the high side, with the node between the first p-type transistor 70 and the first n-type transistor 74 being the first output 80 of the output stage. A second p-type transistor 72 and a second n-type transistor 76 are connected in series with each other and in parallel with the first p-type and n-type transistors, again with the p-type transistor 72 on the high side, with the node between the second p-type and n-type transistors 72, 76 being the second output 82 of the output stage 2. All the transistors in this embodiment are implemented using triple-well technology. The wells of the first and second p-type transistors are connected to the high side line 16, and the wells of the third and fourth n-type transistors are connected to the low side line 18. The wells of the remaining transistors, i.e. the first and second n-type transistors and the third and fourth p-type transistors, are connected to the bias line 38.

The fact that the use of the differential buffer structure shown avoids the need for a separate bias greatly eases circuit layout.

In the embodiment described, all the transistors are extended drain transistors (EDMOS) but other transistor types may also be used.

Figure 3:
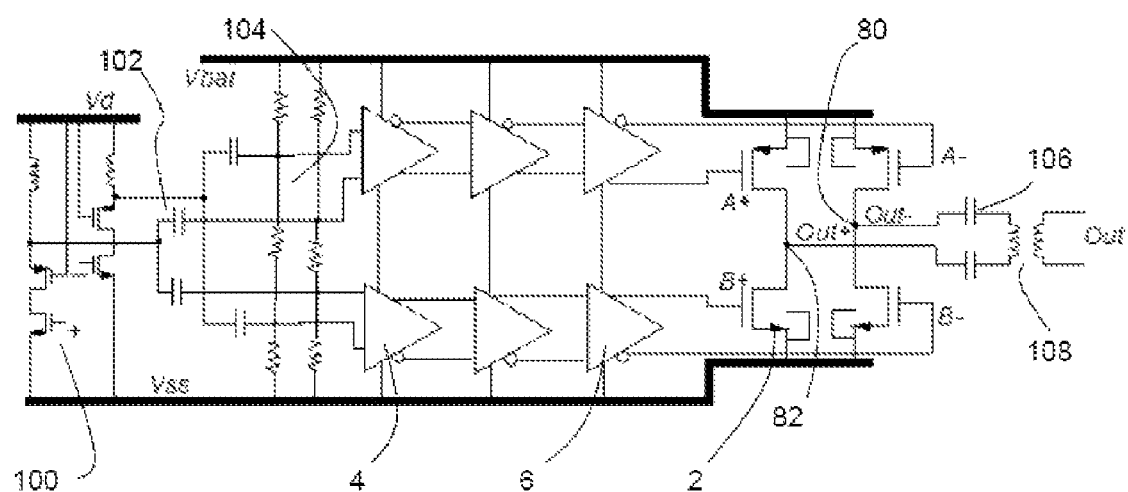
FIG. 3 shows a circuit diagram of a second embodiment of the invention.

FIG. 3 illustrates a first application of the invention in an integrated radio frequency (RF) power amplifier. A battery voltage Vbat (about 5V) and a digital power supply voltage Vd (1.2V) are available. A sinusoidal input voltage Vin with amplitude 2.5V can be provided with a class E inverter 100 supplied with the input voltage Vd. This drives through capacitor couplers 102 and resistive network 104 suitable voltage levels to drive the first buffer stage 4.

The outputs 80,82 of the output stage 2 drive a transformer 106 through capacitive couplers 108.

Figure 4:
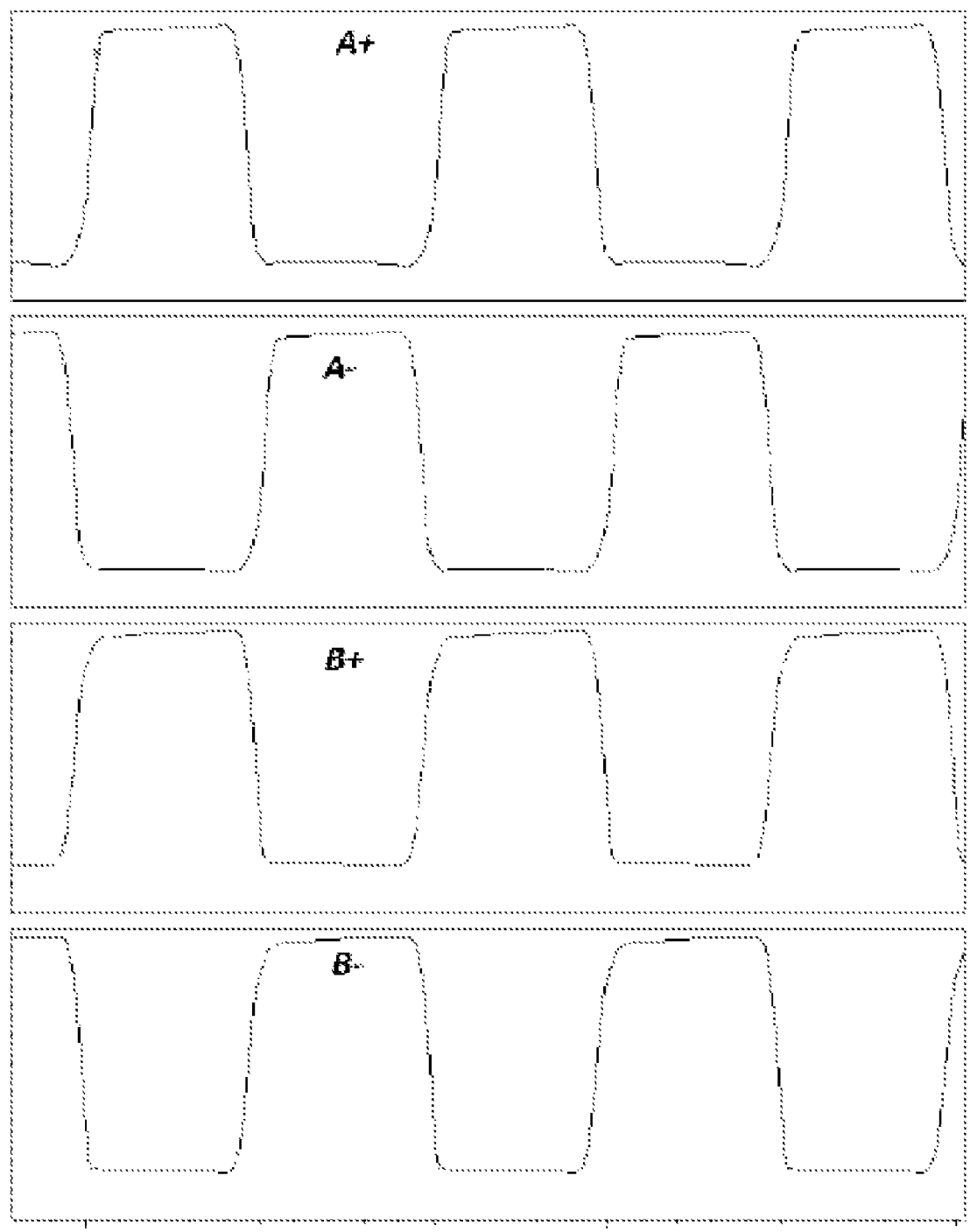
FIGS. 4 and 5 shows calculated voltages on the arrangement of FIG. 3 in use.
Figure 5:
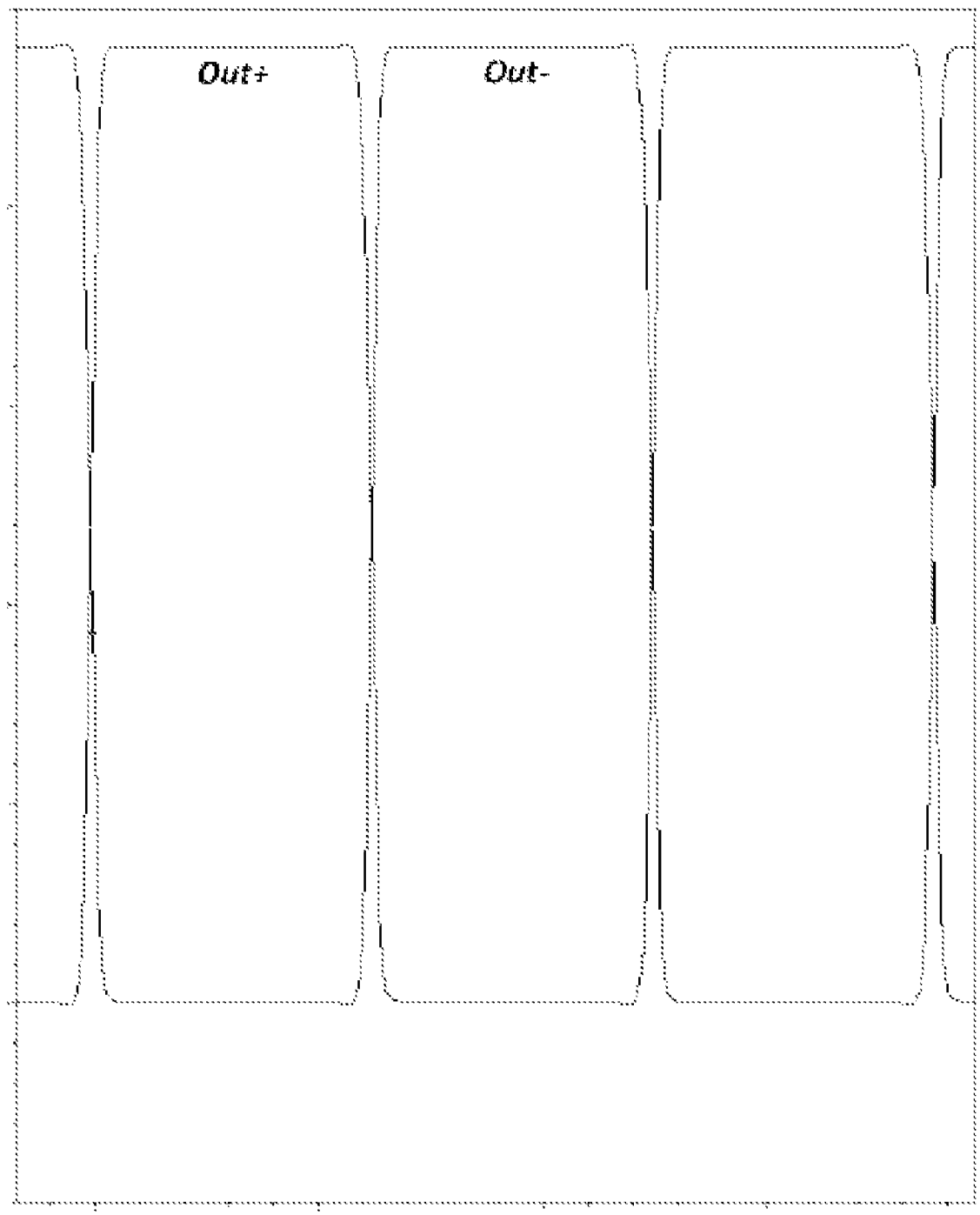

Simulation of the output stage has been carried out and is illustrated in FIGS. 4 and 5. FIG. 4 shows the four output signals of the last buffer stage 6 and FIG. 5 the voltages at outputs 80,82.

Figure 6:
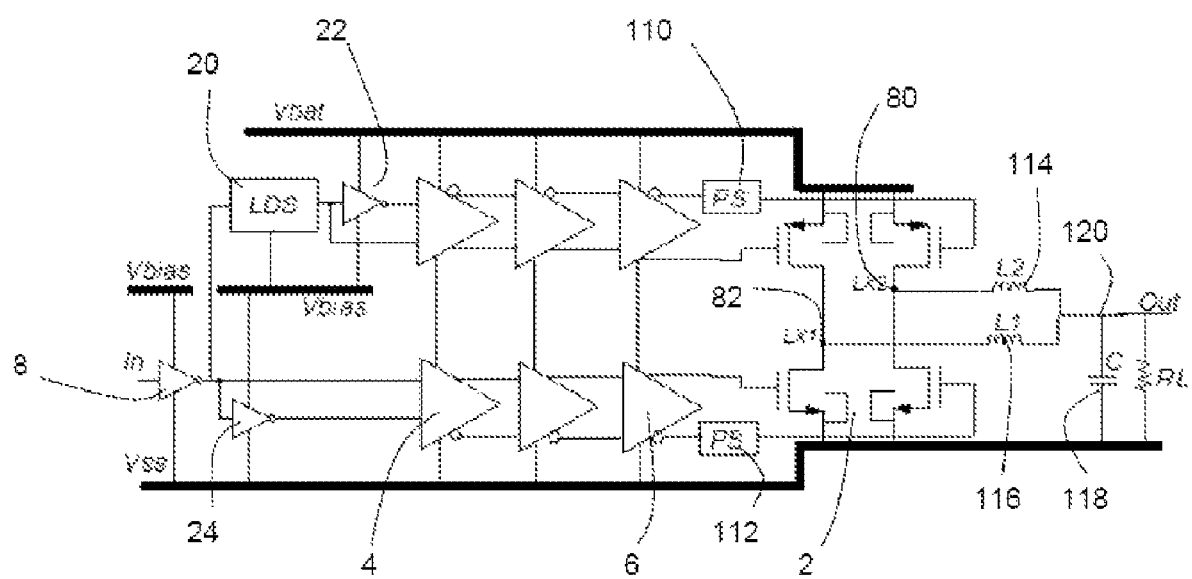
FIG. 6 shows a circuit diagram of a third embodiment of the invention.

FIG. 6 illustrates another application of the invention to power conversion, in particular DC-DC power conversion. The example is an interleaved DC:DC converter. Interleaved DC:DC converters are especially interesting for on-chip power supply generation, because in system-on-chip applications small inductors are preferable due to low silicon area and hence low cost. Small inductors however result in significant ripple on the output voltage. This may be overcome when the DC:DC converter is implemented with multiple parallel blocks, each having a smaller inductor than would otherwise be required, as is the case for an interleaved DC:DC converter.

Referring to FIG. 6, assume a battery voltage Vbat of 5V and an intermediate bias voltage Vbias being available. An input pulse width modulation (PWM) signal is generated in input block 8 and then through level shifter 20 and inverters 22,24 to a series of buffers 4,6. A high side phase shifter 110 and a low side phase shifter 112 are provided between the output of the last buffer 6 and the output stage 2, which shifts the driving signal by 180°.

Each of the outputs 80,82 of output stage 2 are switched through respective inductors 114,116 and across capacitor 118 to drive node 120, which is connected to a load. The capacitor filters ac components. The regulated output voltage is available at the drive node.

In all of these examples, the power routing is much simplified and the required intermediate voltage levels are obtained without additional circuitry.

It should be emphasised that the embodiments shown are only examples and that those skilled in the art will be able to implement the invention in different ways. For example, the number of stages may vary as well as the detailed circuit implementation.

Although the embodiment described above uses a triple-well CMOS process for all transistors, the isolation is in fact only required for the transistors in the high side buffers, and the transistors in the low side buffers can, if desired, be implemented in a different process.

The invention claimed is:

1. A driver circuit, comprising:
    an output stage arranged between high and low voltage rails
    at least one buffer stage having a high side buffer and a low side buffer wherein an output of a last buffer stage is connected to the output stage and an input of a first buffer stage is connected to an circuit input;
    wherein the output stage is a differential output stage having a pair of high side differential inputs, a pair of low side differential inputs and a pair of differential stage outputs; and
    in each buffer stage the high side buffer and the low side buffer are each differential buffers with a pair of differential inputs and a pair of differential outputs, each buffer stage being a self-biasing differential buffer stage, and
    each of the high side buffers is implemented by transistors with an isolated well.

2. A circuit according to claim 1 wherein all transistors in the buffer stages are implemented with an isolated well.

3. A driver circuit according to claim 1 wherein each of the transistors implemented with an isolated well is implemented in triple-well CMOS.

4. A driver circuit according to claim 1, wherein in each buffer stage:
- the outputs of the high side buffer are first and second differential outputs;
- the outputs of the low side buffer are third and fourth differential outputs;
- the inputs of the high side buffer are first and second differential inputs;
- the inputs of the low side buffer are third and fourth differential inputs;
- the high side buffer comprises a first p-type transistor and a first n-type transistor in series, with the first differential output between the first p-type transistor and the first n-type transistor and the gates of the first p-type transistor and the first n-type transistor connected to the first differential input;
- a second p-type transistor and a second n-type transistor, in parallel with the first p-type transistor and the first n-type transistor, with the second differential output between the second p-type transistor and the second n-type transistor and the gates of the second p-type transistor and the second n-type transistor connected to the second differential input;
- the low side buffer comprises a third p-type transistor and a third n-type transistor in series, with the third differential output between the third p-type transistor and the third n-type transistor and the gates of the third p-type transistor and the third n-type transistor connected to the third differential input; and
- a fourth p-type transistor and a fourth n-type transistor, in parallel with the third p-type transistor and the third p-type transistor, with the fourth differential output between the fourth p-type transistor and the fourth n-type transistor and the gates of the fourth p-type transistor and the fourth n-type transistor connected to the fourth differential input.

5. A driver circuit according to claim 4, wherein the first and second p-type transistors have a source connected well and the first and second n-type transistors have a source connected well.

6. A driver circuit according to claim 1 having a plurality of buffer stages arranged in series, the output of each buffer stage except the last buffer stage being connected to the input of the next buffer stage.

7. A driver circuit according to claim 1 wherein
- the circuit input is connected to one of the differential inputs of the low side buffer of the first buffer stage and to the other of the differential inputs of the low side buffer of the first buffer stage;
- the circuit input is connected to the input of a level shift circuit; and
- the output of the level shift circuit is connected to one of the differential inputs of the high side buffer of the first buffer stage and to the other of the differential inputs of the high side buffer of the first buffer stage.

8. A driver circuit according to claim 1 wherein the outputs of the output stage are connected through isolation capacitors to a transformer stage.

9. A driver circuit according to claim 1, further comprising
- a plurality of capacitors for supplying an ac input signal to the inputs of the first buffer stage; and
- a resistive network between the high and low voltage rails for setting the dc voltage bias at the inputs of the first buffer stage.

10. A driver circuit according to claim 1 further comprising:
- a high side phase shift circuit between one of the differential outputs of the high side buffer of the last buffer stage and one of the high side differential inputs of the output stage; and
- a low side phase shift circuit between one of the differential outputs of the low side buffer of the last buffer stage and one of the low side differential inputs of the output stage;
- wherein each of the outputs of the output stage is connected through a respective inductor to a dc drive node, the dc drive node being connected through a smoothing capacitor to the low side voltage rail so that the circuit acts as a voltage regulator outputting a regulated dc voltage on the dc drive node.

* * * * *